United States Patent [19]

Termanis

[11] 4,148,549
[45] Apr. 10, 1979

[54] DIFFRACTION GRATINGS

[75] Inventor: Alexander Termanis, Canterbury, England

[73] Assignee: The Rank Organisation Ltd., London, England

[21] Appl. No.: 748,409

[22] Filed: Dec. 8, 1976

[30] Foreign Application Priority Data

Dec. 8, 1975 [GB] United Kingdom ............... 50270/75

[51] Int. Cl.² .................. G03H 1/06; G03H 1/32; G02B 27/38
[52] U.S. Cl. .................. 350/3.70; 350/162 R
[58] Field of Search .......... 350/3.5, 162 R, 3.70–3.73; 356/109

[56] References Cited

U.S. PATENT DOCUMENTS

| 3,622,220 | 11/1971 | Kogelnik | 350/162 R |
| 3,728,117 | 4/1973 | Heidenhain et al. | 350/162 R |
| 4,054,356 | 10/1977 | Noguchi | 350/3.72 |

FOREIGN PATENT DOCUMENTS

| 1094484 | 12/1960 | Fed. Rep. of Germany | 350/3.5 |
| 1384281 | 2/1975 | United Kingdom | 350/162 R |

OTHER PUBLICATIONS

George et al., *Applied Physics Letters*, vol. 9, No. 5, Sep. 1966, pp. 212–215.
Stroke et al., *Applied Physics Letters*, vol. 7, No. 9, Nov. 1965, pp. 229–230.
Shank et al., *Applied Physics Letters*, vol. 23, No. 3, Aug. 1973, pp. 154–155.
Kato et al., *Applied Optics*, vol. 14, No. 5, May 1975, pp. 1093–1099.

Primary Examiner—Ronald J. Stern
Attorney, Agent, or Firm—Brisebois & Kruger

[57] ABSTRACT

A method, and apparatus for performing the method, of manufacturing a blazed diffraction grating by making a photographic record of the interference fringes produced at the intersection of two coherent secondary light beams derived from a common coherent primary light beam, in which one of the two secondary light beams is compressed or expanded in at least one dimension before it is incident on the region where intersection with the other beam takes place, the angle of intersection between the two secondary beams being such that they are perfectly in register across a certain plane in the region of intersection, the interference fringes formed at the plane being recorded photographically by exposing a photo-sensitive material, preferably an etchable photo-resist, at this plane. Expansion can be achieved by passing one of the recording beams through a prism or by effecting the separation of the primary beam into two secondary beams by means of a blazed diffraction grating.

13 Claims, 6 Drawing Figures

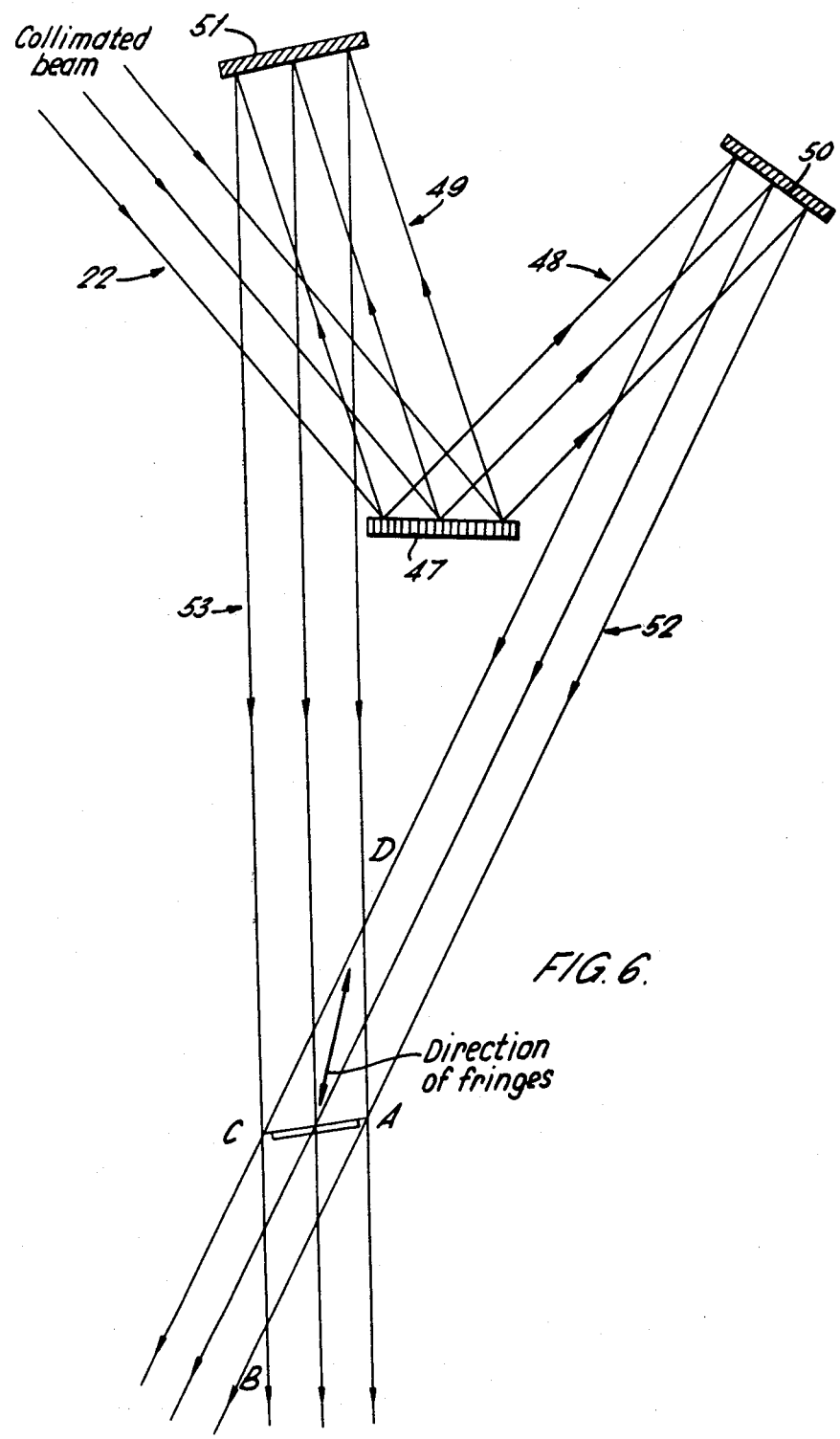

DIFFRACTION GRATINGS

The present invention relates to diffraction gratings, and particularly to diffraction gratings of the type produced as a photographic record of interference fringes obtained by intersecting two coherent beams of light.

The present invention also comprehends a method of making such diffraction gratings and is concerned, in particular, with the manufacture of blazed diffraction gratings which, in use, throw the majority of the diffracted light energy into one, or a small number, of orders of diffraction.

Techniques for the photographic production of diffraction gratings as a record of interference fringes are known as such. For the production of such gratings a photographically sensitive material known as photoresist is coated on a substrate (the grating blank) and located in a position at which the interference fringes can be formed. The resistance of the photo-resist to certain etching chemicals is dependent, when developed, on the intensity of light received upon exposure of the photo-resist, and thus, by developing and etching the film of photo-resist a diffraction grating can be produced the topography of which is directly related to the shape and intensity of the interference fringes to which the photo-resist was exposed.

It is well known that for the production of interference fringes it is necessary to intersect two coherent beams of light, and such coherent beams of light are usually produced as secondary beams by the separation of a primary beam of coherent light from a suitable source such as a laser. In practice, however, static dust on the optical elements through which the beam passes causes the production of a number of subsidiary interference patterns which are not wanted in the ultimately produced interference fringes. Furthermore, any small imperfections in the optical components used in the apparatus for producing the fringes will also give rise to a series of spurious interference fringes. This is sometimes referred to as the "orange peel" effect. Such imperfections in the interference fringes, which are to be photographically recorded in the production of the diffraction grating, causes unwanted scattering in a grating so produced.

In order to overcome this problem the light in the primary beam can be rendered spatially non-coherent by passing it through a rotating diffuser before it is separated into the two secondary beams which will be used to generate the desired interference fringes to be recorded. There is a drawback to this arrangement, however, in that the secondary beams, since their spatial coherence is reduced to an arbitrarily low level must be in exact positional register in order to provide fringes which can be observed. This means, in practice, that the two secondary beams must be of exactly the same cross-sectional size and the angle of incidence of the two secondary beams on the plane at which the interference fringes are to be produced must be exactly equal to one another and must be parts of a single amplitude divided beam: This means that for a given wavelength of light and a given photo-resist, only a single blaze wavelength can be obtained irrespective of the grating pitch. The production of blazed diffraction gratings having different blaze wavelengths, but a common grating pitch, cannot thus conveniently be made if the system of reducing spatial coherence by means of a rotating diffuser is utilised. This system of reducing spatial coherence, however, is extremely effective in reducing "noise" due to the above mentioned speckle effect, and accordingly some method of changing the blaze wavelength while nevertheless making use of a diffuser in the primary beam has been sought.

A solution to this problem has been found by the method of the present invention, according to which there is provided a method of producing a blazed diffraction grating by making a photographic record of the interference fringes produced at the intersection of two coherent secondary light beams derived from a common coherent primary beam, in which the spatial coherence of the primary beam is at least reduced by passing it through a rotating diffuser, and one of the secondary beams is laterally compressed or expanded in relation to the other by an amount related to the angle of intersection at the region of interference between the two secondary beams such that both beams are in register across at least one plane in the region of intersection of the two beams, a photographically sensitive surface being located at this plane to record the interference fringes so produced.

Reference herein to a plane where two intersecting light beams are "in register" will be understood to refer to a plane where a wavefront of one beam interfers with only one wavefront of the other beam. It is only at such a plane that interference fringes can be observed even though interference as such takes place over the whole of the region where the two beams intersect.

Various procedural modifications can be incorporated into the method defined above. For example, the primary beam may be passed through two diffusers, one sthationary and one rotating, placed closely adjacent one another.

The lateral compression of one of the interfering secondary beams may be effected in any one of a number of ways. For example, one of the beams may be passed through a prism located so that the optical path is asymmetric, whereby the output beam is reduced, in one dimension of the cross section, in relation to the input beam.

Alternatively, a diffraction grating may be used to effect the separation of the primary beam into the two secondary beams, and in this case, one order beam will be compressed or expanded in relation to the other. Of course, a diffraction grating which throws the incident light into two orders (or at least the majority of the incident light into two orders) should be selected. Such a grating acts, therefore, both as means to separate the primary beam into secondary beams, and also as means for relatively compressing or expanding one of the secondary beams in relation to the other.

The photographic record is obtained by locating a film or layer of photographic material in the plane in which the two secondary light beams interfere. Because of the reduction in spatial coherence of the primary beam, although the two beams will interfere in the whole of the intersecting region, interference fringes will only be observable in a single plane, that is the plane in which both beams are exactly in register. This plane may be parallel or perpendicular to the plane bisecting the lines of the two incident beams depending on whether the two secondary beams are laterally inverted with respect to one another or not. If each secondary beam is reflected the same number of times between the beam separation means and the region of intersection then the two beams will be in "normal" register whereas if one beam is reflected an odd number of times more than the other the beams will be in "inverted" register at the intersection region.

It is preferred that the primary beam is collimated, and this may be effected in any of a number of ways, although conveniently the light in the primary beam is focused at the diffuser, so that it is divergent away therefrom. In such a case a concave mirror may be used to reflect the light towards the beam separating means and at the same time to collimate the beam. Alternatively, a convergent lens system may be used.

In order to obtain high blaze angles a grating blank carrying the said photograhically sensitive surface, may be located in a cell containing a suitable liquid, the cell having two transparent windows through which respective interfering secondary beams are incident on the photographically sensitive surface. The suitable liquid may be carbon tetrachloride, liquid paraffin, silicone oil or the like.

Another way in which high blaze angles can be produced, particularly if a relatively coarse pitch is required, is to reflect the two secondary beams produced by the beam separating device back on either side of the beam separating device to intersect at a small angle to one another.

The present invention also comprehends apparatus for performing the method defined above, comprising a source of a primary beam of coherent light, a rotary diffuser for at least reducing the spatial coherence of the primary beam, means for separating the primary beam into two secondary beams, means for laterally compressing or expanding one of the two secondary beams with respect to the other, and means for directing the two secondary beams along respective paths along at least one point of which they intersect, the said lateral compression or expansion means operating to cause such a degree of lateral compression or expansion that the two secondary beams are exactly in register in one plane passing through the region of intersecting whereby they interfere to produce a pattern of interference fringes observable along the said plane, and means for photographically recording the pattern of interference fringes formed in the said plane, passing through the region of intersection whereby they interfere to produce an interference pattern observable along the said plane, there being provided means for photographically recording the pattern of interference fringes formed in this plane.

Embodiments of the present invention will now be more particularly described, by way of example, with reference to the accompanying drawings, in which:

FIG. 6 is a schematic diagram illustrating a further system for producing a diffraction grating in accordance with the method of the present invention.

Figure 1:
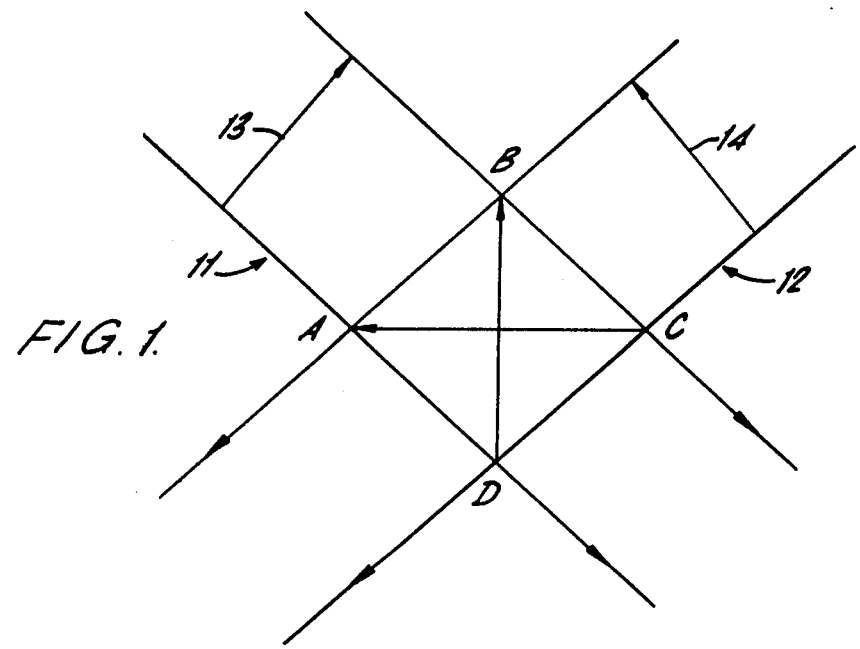
FIG. 1 is a diagram illustrating the intersecting region of two coherent light beams.

Referring now to FIG. 1 there are shown two coherent light beams 11, 12 which have been produced by splitting a primary beam of coherent radiation. The arrows 13, 14 illustrate the relative orientation of the two beams with respect to their orientation in the primary light beam. If the two coherent light beams are unmodified, interference fringes will be produced throughout the whole of the intersecting region indicated by the quadrangle of points A, B, C, D, and a suitably placed photographic film can be used to record the interference fringes within this region; the fringes extend in the direction of the arrow BD. If, on the other hand, the primary beam was modified by passing it through a diffuser to reduce the spatial coherence of this beam, interference fringes can only occur where the two secondary beams 11, 12 are in exact register; in the situation illustrated in FIG. 1 this is only along a plane indicated by the arrow BD. Interference fringes are only observable along this plane, therefore, and thus a photographic film must be placed in this plane in order to record the fringes.

Figure 2:
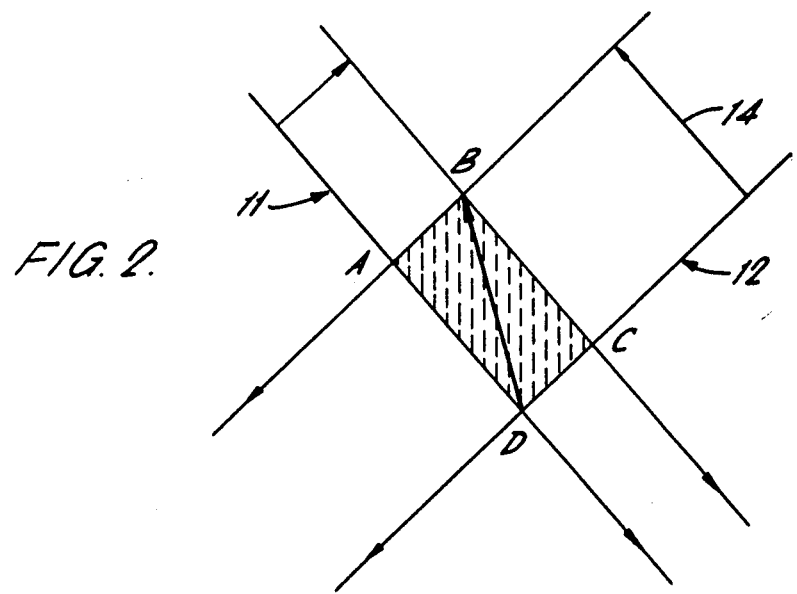
FIG. 2 is a diagram illustrating the intersecting region of two coherent light beams modified in accordance with the method of the invention.

The solution provided by the invention to this problem, to enable the production of blazed gratings having different blaze wavelengths from the same wavelength (and therefore the same grating pitch or fringe spacing) is achieved by compressing the beam 11 with respect to the beam 14. If, as shown in FIG. 2, the angles of intersection remain unchanged, the plane at which interference fringes can be observed is turned through an angle from the plane indicated by the line BD in FIG. 1 to the plane indicated by the line BD in FIG. 2. Since the angle of incidence of the two light beams, and the wavelength of the light, are the same, the interference fringes extend in the same direction as in FIG. 2, and have the same spacing (these being indicated by the broken lines within the quadrilateral A,B,C,D, as shown in FIG. 2), but the form of the quadrilateral A,B,C,D is modified by the reduction in width of the beam 11.

Figure 3:
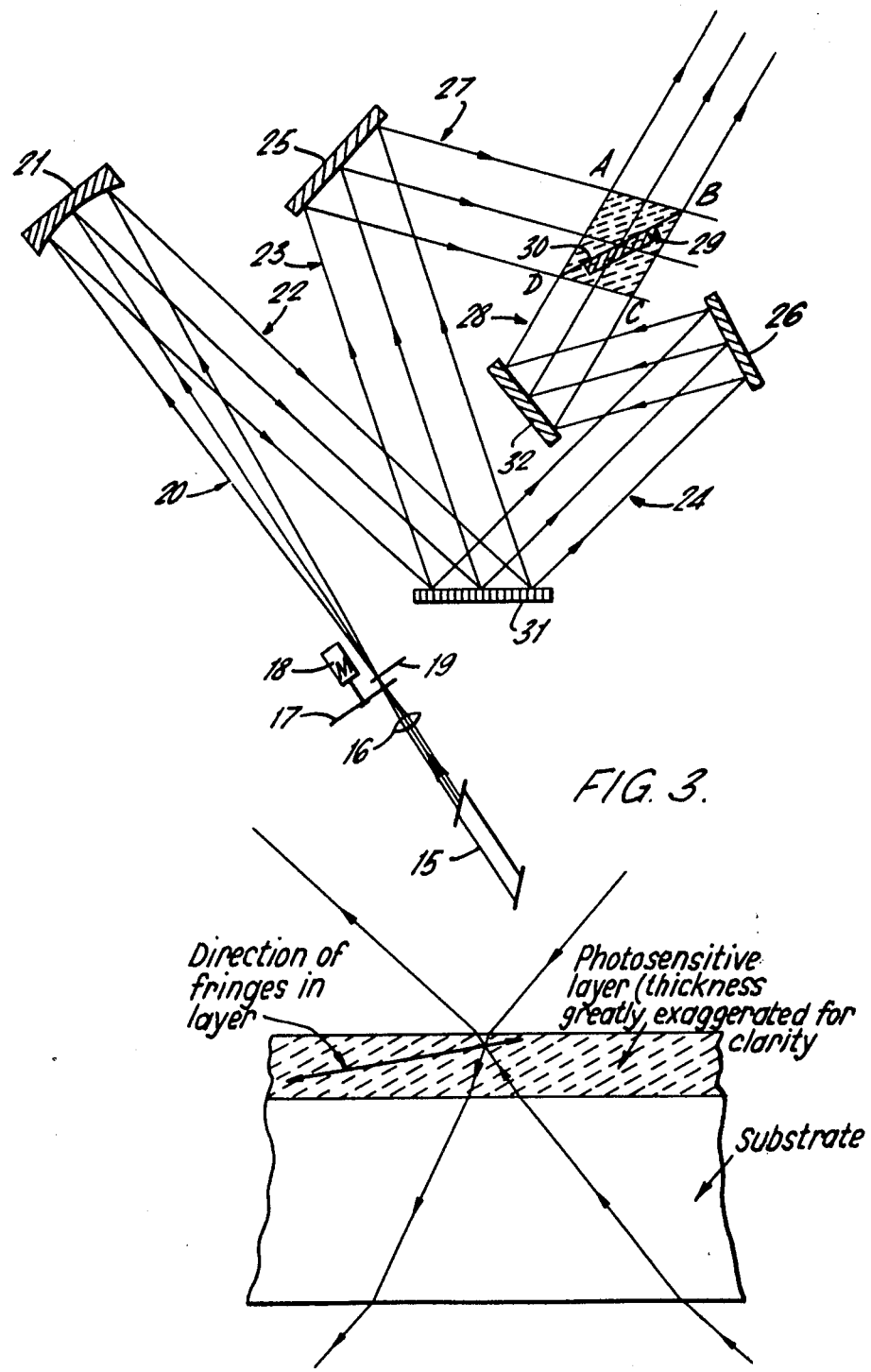
FIG. 3 is a schematic diagram illustrating one system for producing a diffraction grating in accordance with the present invention.

A practical system for achieving this is shown in FIG. 3 in which light from a laser 15, which is in a narrow substantially collimated beam, is focused by a lens 16 onto a rotating diffuser 17 which is driven to rotate by a motor 18. Immediately behind the diffuser 17 is a stationary diffuser 19 from which the diverging light beam, indicated 20, is directed towards a concave mirror 21 which is positioned at a distance corresponding to its focal length from the focal point of the lens 16, but inclined with respect to the axis of the light beam 20 so that the reflected light is directed by the mirror 21 as a collimated beam 22 towards a diffraction grating 31.

The grating 31 is one in which the majority of the incident light energy is thrown into a zero order beam and a first order beam (24 and 23 respectively), and as will be seen from FIG. 3 since the angles which these beams make with the plane of the grating are different, the width of the zero order beam and the first order beam are different. The zero order beam is directed towards a reflector 26, and then onto a reflector 32 which directs the beam, now indicated 28, to interfere with a beam 27 which is the light from the beam 23 reflected by a reflector 25.

Again, the region of intersection is indicated by the quadrangle A, B, C, D, and the plane in which the interference fringes produced by the light beams 27, 28 are observable is indicated by the line BD. A grating blank 29, carrying a photographically sensitive film 30, is placed so that the film lies in the plane indicated by the line BD. The direction of the interference fringes is indicated by the broken lines within the quadrangle A, B, C,D. As will be seen these extend at a small angle to the plane of the photographically sensitive material 30.

Figure 4:
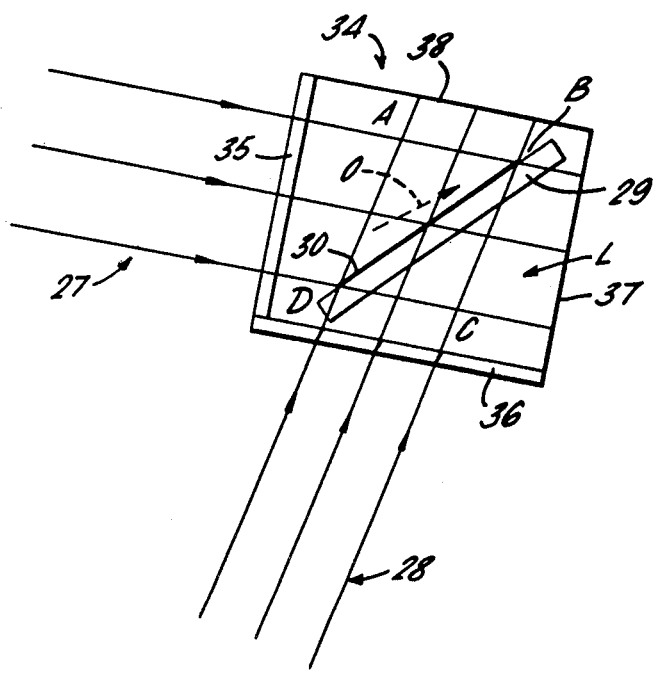
FIG. 4 is a schematic diagram illustrating a modified part of the system of FIG. 3.

Turning now to FIG. 4 there is shown a modification to the system illustrated in FIG. 3 for producing higher blaze angles. For this, the grating blank 29 carrying the photosensitive material 30 is located in a cell 34 at the intersection of the two beams 27, 28. The cell 34 contains a suitable liquid such as carbon tetrachloride, liquid paraffin, silicone oil or the like, and has two plane glass windows 35, 36 forming the two sides of the cell on which the light beams 27, 28 are incident, and two light absorbing or transmitting walls 37, 38. Again, the direction of the fringes is as in the system illustrated in FIG. 3, and is shown in FIG. 4 by the broken arrow O.

Figure 5:
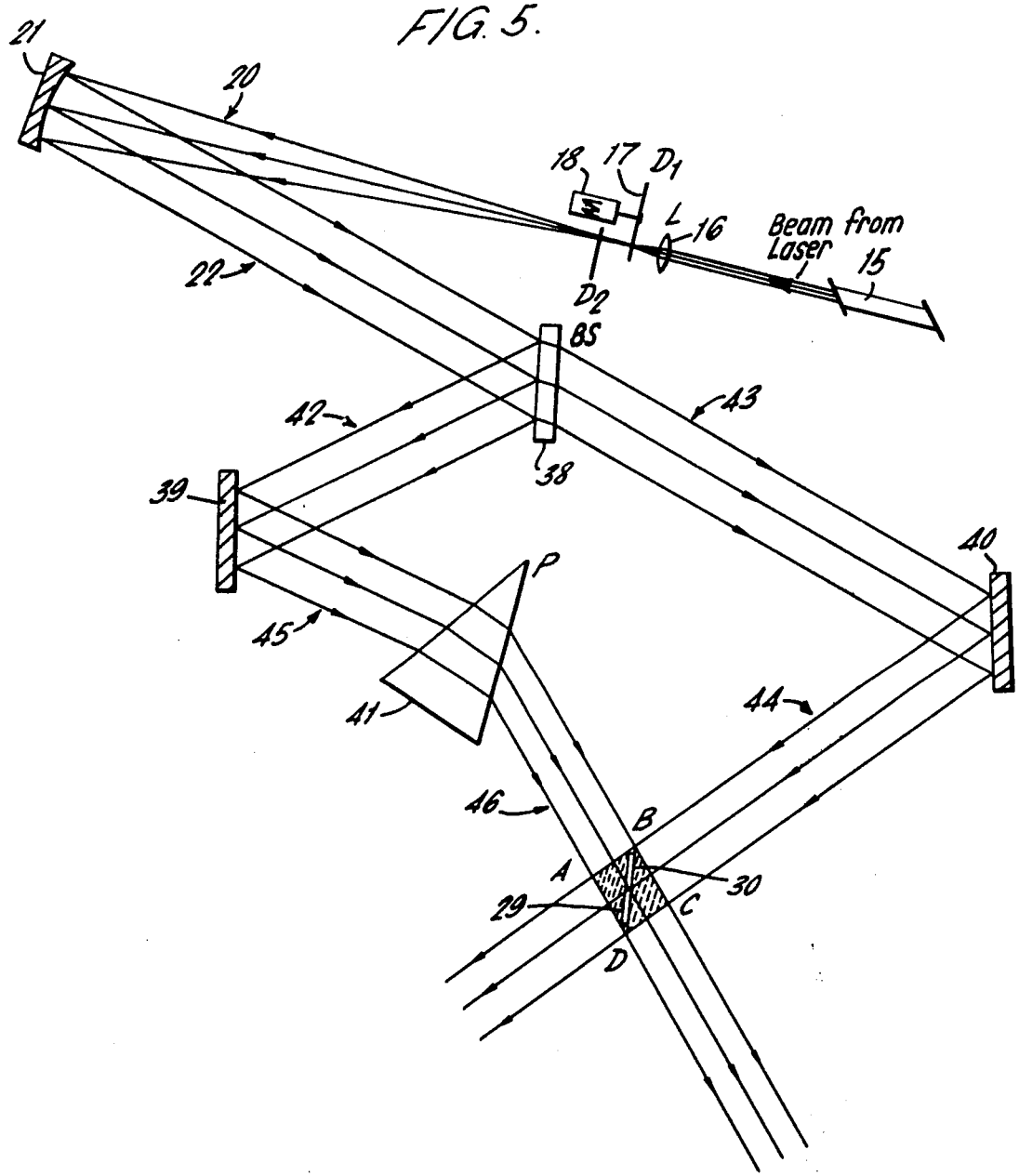
FIG. 5 is a schematic diagram illustrating a second system for producing a diffraction grating in accordance with the method of the present invention.

An alternative system for photograhically recording the fringes is illustrated in FIG. 5. In this system the substantially collimated beam of coherent light 22 is obtained as in the system of FIG. 3, by passing light from a laser 15 through a converging lens 16 focussed at a diffuser 17 driven to rotate by a motor 18. The divergent beam 20 passing from the diffuser 17 is directed through a stationary diffuser 19 and impinges on a concave mirror 21 spaced from the focal point of the lens 16 by a distance equal to its own focal length and inclined in such a way as to reflect the parallel collimated beam 22 towards a beam splitter 38 which, in this embodiment, is in the form of a semi-reflecting mirror. The incident primary beam 22 is separated by the beam splitter 38 into two secondary beams 42, 43 which are incident, respectively, on two mirrors 39, 40. The mirror 39 reflects the incident beam 42, as beam 45 which is incident on a triangular prism 41 which, by refraction, serves to compress the incident beam laterally producing an output beam 46 the transverse dimension of which is reduced in relation of the beam 44 reflected by the mirror 40.

The two secondary beams 44, 46 intersect over a region indicated by the quadrilateral ABCD and a grating blank 29 having a photosensitive layer 30 thereon is placed such that the photosensitive layer lies in the plane indicated by the line BD where the two incident beams 44, 46 are exactly in register and, therefore, at which the interference fringes produced by the two beams are observable.

Finally, FIG. 6 illustrates a simple system for obtaining diffraction gratings which a coarse pitch and high blaze angles. A collimated primary beam 22 is obtained in the same way as in the system of FIG. 5 and is incident on a diffraction grating 47 which throws the light into two orders, the respective beams being indicated 48 and 49. The beam 49, which is the second order beam, is expanded in relation to the beam 48, and the two beams 48, 49 are incident on respective mirrors 50, 51 which are so positioned that they reflect the incident beams, as beams 52, 53, closely past the grating, one on either side thereof, so that they intersect at a region indicated by the quadrilateral ABCD at a shallow angle to one another. In this case, since both beams are reflected only once from the beam splitting device, the two beams are not laterally inverted with respect to one another and accordingly the plane at which fringes are observable, that is where the two beams are exactly in register, extends generally transverse this bisector, as indicated by the line AC. The direction of the fringe is, in this case, not at a small angle to the plane at which fringes are observable, but rather at an angle approaching 90° to this plane. Again, a grating blank 29 having a photosensitive surface 30 is placed at the appropriate plane, in this case the plane indicated by the line AC.

In all the systems described, the photosensitive surface of the grating is exposed for a given time, and then the photo-resist material is developed to a shape in accordance with the pattern of fringes recorded thereon.

I claim:

1. In a method of producing a blazed diffraction grating by making a photographic record of the interference fringes produced at the intersection of two coherent secondary light beams derived from a common coherent primary beam, and comprising the known steps of:

passing said common coherent primary light beam through a rotating diffuser whereby to reduce the spatial coherence of said primary beam, splitting said primary beam to form said two secondary light beams, directing said two secondary light beams along respective different paths and causing them to intersect at a given region, locating a photographically sensitive surface in a selected plane in the said given region of intersection of said two secondary beams and exposing it to said two intersecting secondary beams to record interference fringes produced thereby, the improvement wherein:

the angles of incidence of said secondary beams with respect to said selected plane are different from one another, and one of said secondary beams is laterally compressed or expanded in relation to the other by an amount dependent on the angle of intersection of said two secondary beams at said region of intersection such that both said secondary beams are in register across said selected plane in said region of intersection of said two secondary beams whereby interference fringes are produced at said selected plane.

2. The method of claim 1 wherein lateral compression of one of said interfering secondary light beams is effected by passing it through a prism.

3. The method of claim 1, wherein lateral compression of one of said interfering light beams with respect to the other is achieved by separating said primary beam into said two secondary beams with a diffraction grating so constructed that the majority of the light incident thereon is diffracted into only two orders.

4. The method of claim 1, wherein said photographic material is a photo-resist which upon development after exposure to said interference fringes has a surface topography dependent on the spacing and intensity of said fringes.

5. The method of claim 1, wherein said primary beams from said coherent source is passed through a converging lens and focused on said diffuser to produce a diffused primary beam which is collimated and reflected towards the device which separates it into said two secondary beams, by a concave mirror.

6. The method of claim 1, wherein said separation of said primary beam into two secondary beams is effected by means of a semi-reflecting mirror.

7. The method of claim 1, wherein said two secondary beams produced by said beam separating device are reflected back on either side of said beam separating device to intersect at a small angle of intersection.

8. The method of claim 1, wherein one of said secondary beams is reflected once and the other of said secondary beams is reflected twice, before impinging on said region of intersection and interference.

9. Apparatus for producing a blazed diffraction grating by making a photographic record of the interference fringes produced at the intersection of two coherent secondary light beams derived from a common coherent primary beam, said apparatus comprising,
   a source of a primary beam of coherent light,
   a rotary diffuser operating to at least reduce the spatial coherence of said primary beam,
   means for separating said primary beam into two secondary beams,
   means for laterally compressing or expanding one of said two secondary beams with respect to the other said two secondary beams,
   means for directing said two secondary beams along respective paths along at least one point of which they intersect, said lateral compression or expansion means operating to cause such a degree of lateral compression or expansion of said one beam that said two secondary beams are exactly in register in a selected plane passing through the region of intersection whereby they interfere to produce a pattern of interference fringes observable along said plane, and
   means for photographically recording said pattern of interference fringes formed in said plane.

10. The apparatus of claim 9, wherein said means for separating said primary beam into two secondary beams is a diffraction grating, which also serves as said beam-expanding or compressing means.

11. The apparatus of claim 9, wherein said means for separating said primary beam into said two secondary beams is a semi-reflecting mirror.

12. The apparatus of claim 9, wherein said means for directing said two secondary beams to intersect consist of two mirrors, one in the path of each said secondary beam.

13. The apparatus of claim 12, wherein there is a further mirror in the path of one of said secondary beams for laterally inverting this beam with respect to the other said secondary beam.

* * * * *